United States Patent
Mishiro et al.

(10) Patent No.: US 6,795,170 B2
(45) Date of Patent: Sep. 21, 2004

(54) STRUCTURE FOR ATTACHING A PELLICLE TO A PHOTO-MASK

(75) Inventors: Hitoshi Mishiro, Tokyo (JP); Shinya Kikugawa, Tokyo (JP); Kaname Okada, Kanagawa (JP); Takayuki Kawahara, Ibaraki (JP); Morio Terakado, Ibaraki (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/299,705

(22) Filed: Nov. 20, 2002

(65) Prior Publication Data

US 2003/0095245 A1 May 22, 2003

(30) Foreign Application Priority Data

Nov. 21, 2001 (JP) .................................. 2001-356313
Dec. 14, 2001 (JP) .................................. 2001-381168

(51) Int. Cl.[7] .......................... G03B 27/62; G03B 27/42
(52) U.S. Cl. .................................... 355/75; 355/53
(58) Field of Search ............................. 355/75, 53, 72; 359/629; 428/14; 430/5

(56) References Cited

U.S. PATENT DOCUMENTS 6,303,196 B1 * 10/2001 Funatsu ..................... 428/14
6,524,754 B2 *  2/2003 Eynon ........................ 430/5
2002/0090558 A1 *  7/2002 Shirasaki .................... 430/5

FOREIGN PATENT DOCUMENTS

JP          2002-107915      4/2002

* cited by examiner

Primary Examiner—Peter B. Kim
(74) Attorney, Agent, or Firm—Oblon, Spivak, McClelland, Maier & Neustadt, P.C.

(57) ABSTRACT

A structure for attaching a pellicle to a photomask, the pellicle comprising a pellicle frame and a pellicle sheet attached to an opening portion formed in the pellicle frame, wherein at least a portion of the pellicle frame surface in contact with the photo-mask has a direct contact with the photo-mask without interposing an adhesive.

7 Claims, 3 Drawing Sheets

STRUCTURE FOR ATTACHING A PELLICLE TO A PHOTO-MASK

The present invention relates to a structure for preventing the deposition of foreign substance on a photo-mask or a reticle (hereinbelow, referred generally to as the photo-mask for both members) used in a manufacturing step for an integrated circuit. In particular, the present invention relates to a structure for attaching a pellicle suitable for a photo-lithography method using an $F_2$ laser (wavelength: 157.6 nm) to a photo-mask.

In a photo-lithography process used in a manufacturing step for an integrated circuit, the formation of a pattern is carried out by exposing a semiconductor wafer applied with a photoresist material to light. If a photo-mask has a flaw or a foreign substance depositing on it, the trace of the flaw or the foreign substance is transferred to the wafer together with the pattern, whereby short-circuiting or breaking of wire may cause.

Accordingly, there has been used a method for attaching a pellicle to a single or both surfaces of the photo-mask in order to prevent foreign substance from depositing on the surface or surfaces of the photo-mask.

The conventional pellicle was of a type having an outer configuration as shown in a front view and a side view of FIG. 5, which was formed by bonding a pellicle membrane 2 made of nitrocellulose or a fluorocarbon resin having a thickness of from several nm to several $\mu$m, to a pellicle frame 1 of aluminum or the like with an adhesive 3. When used, the pellicle was fixed so as to cover the pattern formed on the photo-mask. Such pellicle in which the membrane of organic material was used had the following disadvantage. When light of short wavelength was used to obtain accurate light exposure, an organic component was decomposed due to the irradiation of a strong optical energy. Accordingly, the conventional pellicle did not have a sufficient durability to the number of times of irradiation of energy, in other words, to an operating time, in the actual light exposure,. In consideration of this, there has been studied to use a pellicle sheet formed by processing synthesized silica glass into a thin sheet, instead of the pellicle membrane made of an organic resinous material in recent years. The synthesized silica glass is glass consisting substantially of only silicon oxide which is obtained, for example, by growing porous material composed of silicon oxide, called "soot", by reacting a silicon source and an oxygen source in a gaseous phase, followed by sintering. Since the pellicle sheet made of the synthesized silica glass has an excellent transmittance, an anti-reflection membrane is often disposed at its single or both surfaces.

When the pellicle in which the synthesized silica glass is used as the pellicle sheet is actually used in a light exposure step, the synthesized silica glass itself absorbs light energy to generate heat whereby the pellicle sheet expands. Further, the pellicle frame itself receives the heat. Since metal, e.g., aluminum, titanium or the like, which is conventionally used for the material for the pellicle frame has a different thermal expansion coefficient from that of the synthesized silica glass, a stress is generated in the pellicle sheet made of the synthesized silica glass, whereby there may cause a change of light path due to birefringence or a change of light path due to a mechanical flexure. Accordingly, it is desirable that a material for the pellicle frame should have the same or closer thermal expansion coefficient to that of the synthesized silica glass.

On the other hand, when the synthesized silica glass is used for the pellicle sheet, it has been proposed to use a pellicle sheet having a thickness of from 0.01 to 2 mm. However, when a pellicle sheet having such thickness is used in an actual light exposure step and if there is a scattering of thickness in the pellicle sheet, it has been known that exposed light 4 is refracted to change the light path as shown in FIG. 6. The change of light path causes a shift of the position of the pattern to be transferred, and a good lithographic operation can not be conducted. Accordingly, it is proposed that the parallelism of upper and lower planes, which is permissible for the pellicle sheet, is 0.1 $\mu$m/50 mm.

Further, even in a case that a pellicle sheet satisfying the above-mentioned parallelism is used, the shift of the position of the pattern to be transferred is caused if the parallelism between two planes: the pellicle sheet 2 and the surface of the photo-mask 5 opposing to the pellicle sheet 2, which are fixed at upper and lower planes of the pellicle frame 1 as shown in FIG. 7, is bad.

The pellicle is constituted by bonding the pellicle sheet to the pellicle frame. If the flatness of the bonded plane is inaccurate, the pellicle sheet after having been bonded is curved because the pellicle sheet follows the shape of an upper plane of the pellicle frame, or creates an optical problem such as an increased refringence due to the inaccurate flatness. Or, if the flatness of a lower plane of the pellicle frame is inaccurate, distortion or flexure is generated in the pellicle frame itself when it is bonded to the photo-mask, and there is a possibility of causing the flexure in the pellicle sheet.

Accordingly, it is required that the flatness of each plane of the pellicle frame (when the entire surface of an upper or lower plane constituting a frame-like member is considered, the flatness indicates the maximum difference of concave-convex in an ideal plane) is not more than 1 $\mu$m, and the parallelism between the upper and lower planes (the maximum difference at an optional point in the entire surface of the frame-like member) is not more than 2 $\mu$m. Further, it is necessary to take a method for bonding the pellicle sheet to the pellicle frame or the photo-mask to the pellicle frame while the above-mentioned accuracy should be maintained.

As the way of solving the above-mentioned problem, there has been attempted a method for reducing the thickness of an adhesive between the pellicle sheet and the pellicle frame, and an adhesive or a sticking material (hereinbelow, referred simply to as the adhesive for both materials) between the photo-mask and the pellicle frame.

These adhesives are generally composed of an organic material. Accordingly, when light having a large energy is irradiated as described before, the adhesive is decomposed or deteriorated to cause peeling-off or generation of dust at the bonded portions, or gas generated from an organic component reduces the transmittance of light having a usable wavelength.

On the other hand, the inventors of this application proposed, approach to prevent the deterioration of an adhesive between the pellicle sheet and the pellicle frame in Japanese Patent Application No. 2000-302306. According to this approach, it can be expected to obtain a predetermined effect if the above-mentioned flatness of the bonded portion of the pellicle frame is satisfied. However, the above-mentioned invention does not mention a sufficient approach to the bonding between the pellicle frame and the photo-mask.

There is also a problem in the method for obtaining the pellicle frame having a sufficient accuracy of configuration.

When a frame-like member is produced from silica glass, there is considered a method that a rod-like member is fused and treated to form a frame-like member, or a method that silicon oxide powder put in a mold is heated for vitrification to form a frame-like member, then, polishing is carried out for upper and lower planes of the frame-like member.

When the conventional polishing method (i.e. single face polishing) is applied to the manufacture of the pellicle frame, it may be possible to obtain a good flatness for each plane of the pellicle frame. However, in evaluation as to whether or not each plane has been able to be processed to have a predetermined accuracy, the conventional optical measuring method using a Newton ring is insufficient for the analysis for its shape because the frame width of the pellicle frame is narrow as about 1 to 5 mm. An accurate measurement can not be expected unless an expensive device such as a three-dimensional measuring instrument is used.

Further, when a frame-like member made of silica glass is processed with a double face polishing machine in order to obtain an excellent parallelism, there were disadvantages as follows. The pellicle frame has generally outer dimensions of 120×120 mm or more, a frame width of 1 to 5 mm and a height of 3 to 6 mm. Accordingly, it is weak in strength as a whole. Accordingly, the pellicle frame was broken during the processing. In order to avoid the breakage, it was necessary to conduct a light polishing operation with light load and low revolution for a long time, whereby working efficiency was reduced remarkably.

The inventors of this application have achieved the present invention by finding that the surface of the pellicle frame to be bonded to the photo-mask can be made flat with high accuracy.

In accordance with the present invention, there is provided a structure for attaching a pellicle to a photo-mask wherein the pellicle comprises a pellicle frame and a pellicle sheet attached to an opening portion formed in the pellicle frame, the structure for attaching a pellicle to a photo-mask being characterized in that at least a portion of the pellicle frame surface in contact with the photo-mask has a direct contact with the photo-mask without interposing an adhesive.

Namely, it is considered that the parallelism between the pellicle sheet and the plane of photo-mask can be maintained when they contact with each other in their entire plane area or a part of the plane without interposing an adhesive. As examples of the structure for this purpose, there are following methods: (1) an auxiliary member for pressing the pellicle frame to the photo-mask is used. In particular, an auxiliary member having an L-shape in cross section is made engagement with at least a part of the pellicle, and the auxiliary member is bonded to the photo-mask to press the pellicle frame to the photo-mask, (2) an adhesive is disposed at an outer circumferential portion of the pellicle frame and the pellicle frame is bonded to the photo-mask, and (3) a concave portion is formed by processing the pellicle frame surface to bonded to the photo-mask, and the pellicle frame is bonded to the photo-mask by filling an adhesive in the concave portion.

The adhesive referred to in this text may be a poly butene resin type, acrylic resin type, epoxy type, silicone type, fluorocarbon resin type or the like in the same manner as used in the conventional technique. Further, the adhesive referred to in this text includes a sticking material.

For the material for the pellicle sheet, there is no limitation as far as the material can transmit exposed light. However, it is preferable to use synthesized silica glass because it has a high transparency and durability to ultraviolet rays of short wavelength.

The material for the pellicle frame is desirably such one having the same thermal expansion coefficient as the synthesized silica glass. In this connection, the synthesized silica glass is the most desirable, and fused silica glass, glass having other components, ceramics, an alloy or the like may be used.

Further, the present invention is to provide a structure for attaching the pellicle produced by a method including the following steps to a photo-mask, in order to make the pellicle frame surface to be bonded to the photo-mask flat with high accuracy, and to make the parallelism between upper and lower planes of the pellicle frame parallel with high accuracy;

a preparation step of preparing a silica glass sheet having larger outer dimensions than the outer configuration of the pellicle frame and a larger thickness than the height of the pellicle frame;

a polishing step of polishing both surfaces of the silica glass sheet, and a processing step of processing the silica glass sheet after the polishing to obtain a frame-like member.

Figure 1:
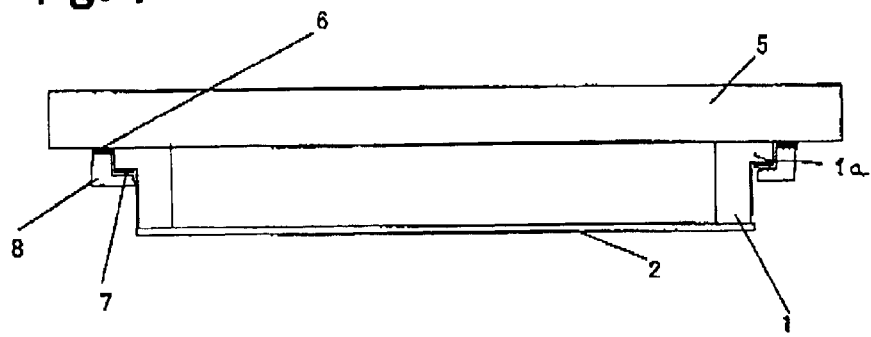
FIG. 1 is a cross-sectional view showing the pellicle according to a first embodiment of the present invention.

In the following, preferred embodiments of the pellicle according to the present invention will be described with reference to the drawing.

FIG. 1 is a diagrammatical cross-sectional view of the pellicle according to the first embodiment of the present invention wherein a pellicle is attached to a photo-mask.

A protrusion 1a is formed integrally with an outer circumferential side portion of a pellicle frame 1 thereby to form a step portion wherein the protrusion 1a has a plane extending in parallel to a horizontal surface of the pellicle frame 1, which is to be bonded to a photo-mask 5. The plane of the protrusion 1a is engaged with an engaged plane which is a horizontal portion of an auxiliary member 8 having an L-shaped body in cross-section. Then, the pellicle frame 1 is pressed toward the photo-mask 5 by means of the auxiliary member 8. Further, the top portion of the auxiliary member 8 having an L-shaped body is joined to the photo-mask 5, the top portion serving as a bonded plane. When the pellicle frame is fixed to the photo-mask 5, an adhesive is applied to a bonded plane 6 at which the auxiliary member 8 contacts the photo-mask 5 and an engaged plane 7 at which the auxiliary member 8 contacts an upper plane of the protrusion 1a of the pellicle frame 1. Accordingly, the pellicle frame 1 can be held firmly without using an adhesive between the photo-mask and the pellicle frame.

In this case, although it is not always necessary to apply an adhesive to the engaged plane 7, the application of the adhesive is effective in order to provide a slight cushion at the plane 7. Further, the protrusion 1a of the pellicle frame 1 and the auxiliary member 8 are not always necessary to extend in the entire circumferential portion of the pellicle frame 1, but they may be arranged at the outer circumferential portion discretely. In addition, it is unnecessary that the protrusion is in parallel to an upper plane of the photo-mask. It is enough that the protrusion can be engaged with the auxiliary member.

Further, the auxiliary member may not have an L-shaped body, but may be provided with at least a bonded plane to be bonded to the photo-mask and an engaged plane to be engaged with the pellicle.

Figure 2:
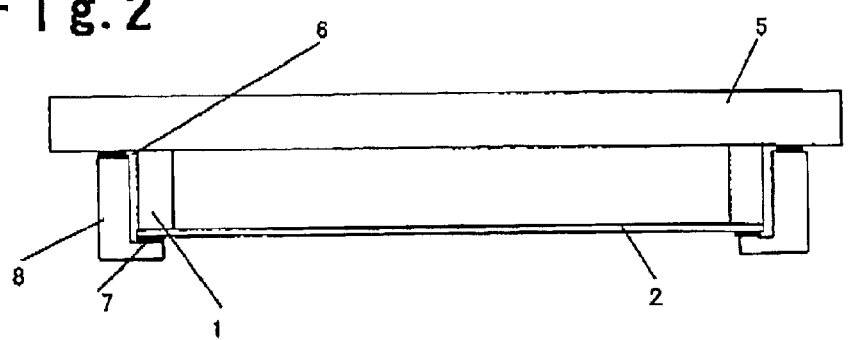
FIG. 2 is a cross-sectional view showing the pellicle as a modification of the first embodiment of the present invention.

FIG. 2 is a diagrammatical cross-sectional view of the pellicle as a modification of the first embodiment wherein the pellicle is attached to the photo-mask.

In this embodiment, a pellicle frame 1 is pressed to a photo-mask 5 by engaging an auxiliary member 8 having a L-shaped body in cross-section with the surface of a pellicle sheet 2, which does not contact the pellicle frame 1. In this case also, it is necessary to apply an adhesive to a bonded plane 6 between the photo-mask 5 and the auxiliary member 8, but it is not always necessary to use an adhesive to an engaged plane 7 between the auxiliary member 8 and the pellicle sheet 2. Further, the auxiliary member 8 is not always necessary to surround the entire periphery of the pellicle frame 1, but may be arranged at several locations discretely.

The auxiliary member 8 is not always necessary to have the L-shaped body, but may be provided with at least a bonded plane to be bonded to the photo-mask and an engaged plane to be engaged with the pellicle in the same manner as the first embodiment.

Figure 3:
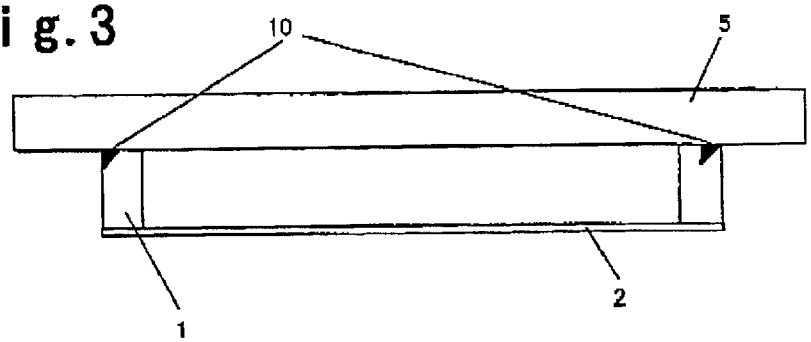
FIG. 3 is a cross-sectional view showing the pellicle according to another embodiment of the present invention.

FIG. 3 is a diagrammatical cross-sectional view of the pellicle according to the another embodiment of the present invention wherein the pellicle is attached to the photo-mask.

This embodiment is characterized by forming a notch portion 10 at the edge portion which is formed by the surface of the pellicle frame 1 to be bonded to the photo-mask 5 and a side surface of it so that the pellicle frame 1 can be bonded to the photo-mask 5 by filling an adhesive in the notch portion 10. In this embodiment, the notch portion 10 is formed to have a C-chamfered shape in order to facilitate easy processing. However, it may have another shape such as a rectangular notch. Further, in order to perform the same purpose as described above, an adhesive may be molded at the boundary defined by the photo-mask surface and an outer circumferential side surface of the pellicle frame 1.

Figure 4:
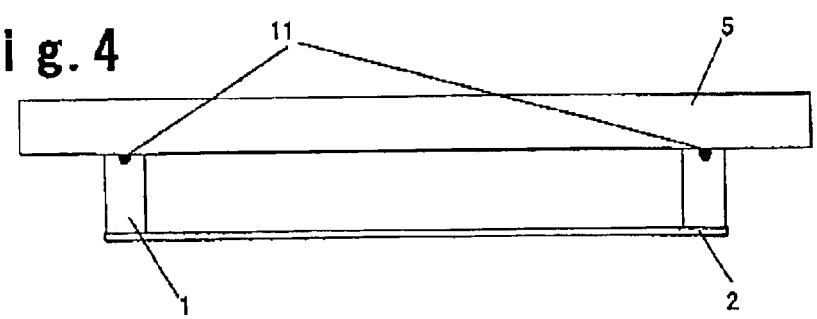
FIG. 4 is a cross-sectional view showing the pellicle according to another embodiment of the present invention.
Figure 5:
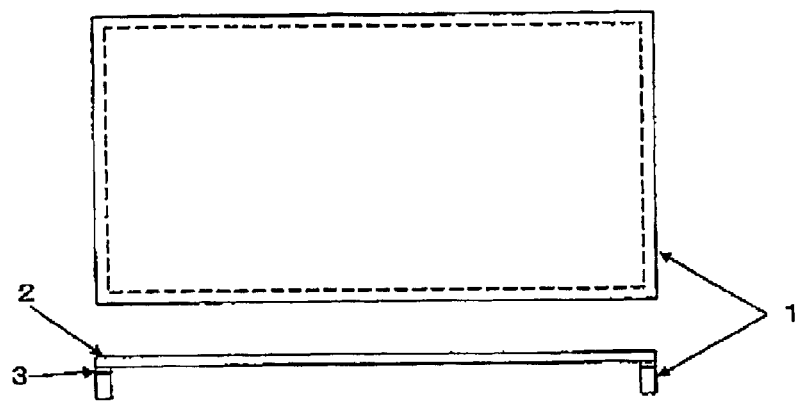
FIG. 5 shows a front view and a side view showing a conventional pellicle.
Figure 6:
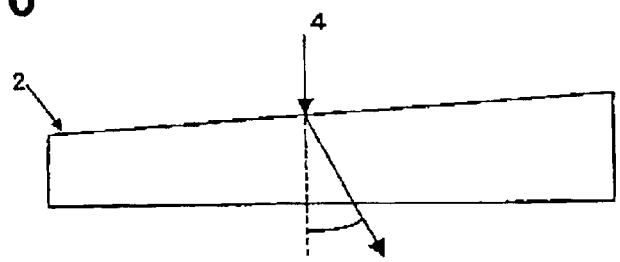
FIG. 6 is a diagram explaining a shift of the light path of exposed light due to a pellicle sheet having an inaccurate parallelism.
Figure 7:
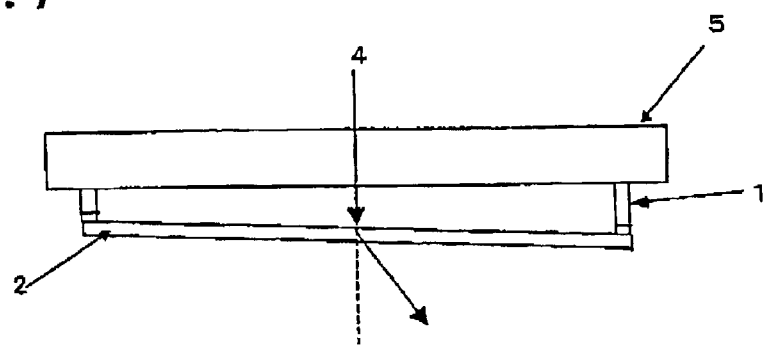
FIG. 7 is a diagram explaining a shift of the light path of exposed light due to an inaccurate parallelism between the pellicle sheet and the photo-mask.

FIG. 4 is a diagrammatical cross-sectional view of the pellicle according to another embodiment of the present invention wherein the pellicle is attached to the photo-mask.

This embodiment is characterized in that a concave portion 11 is formed in the surface of a pellicle frame 1 to be bonded to a photo-mask 5 by, for example, a cutting operation, so that the pellicle frame 1 can be bonded to the photo-mask surface by means of an adhesive filled in the concave portion 11. The concave portion 11 is not always necessary to extend to the entire periphery of the pellicle frame 1, but may be arranged discretely in the surface to be bonded. The concave portion is not limited to have the shape shown in FIG. 4, but may have a pyramidal or semi-spherical shape.

In the present invention, the shapes of structural elements of the pellicle are not limited to those is described in the above-mentioned embodiments, and desired shapes can be used as far as the spirit of the present invention is maintained.

Next, explanation will be made as to a processing method for the pellicle frame in a case that silica glass (which includes both synthesized silica glass and fused silica glass) is used as the material for the pellicle frame.

Silica glass used for the material for the pellicle frame may be either synthesized silica glass or fused silica glass. Use of such material reduces the rate of the occurrence of birefringence in the pellicle sheet due to a temperature change of the pellicle subjecting to exposure to light, and influence to the dimensional accuracy of a pattern to be exposure to light can be lessened. Further, the distortion of the pellicle which is caused by a difference of thermal expansion between the pellicle frame and the pellicle sheet due to a temperature change at the time of exposure to light and transportation, is avoidable. In particular, the above-mentioned material provides a good parallelism after the processing because of a small thermal distortion during the processing of the frame.

When the synthesized silica glass is used, a plate-like original material can easily be obtained by slicing a shaped block of the synthesized silica glass. When the fused silica glass is used, a plate-like original material can easily be obtained by slicing a block glass formed from molten glass, or by forming it into a sheet-like form. The plate-like original material should have larger outer dimensions than an outer configuration of the finally obtainable pellicle frame and a larger thickness than a height of the finally obtainable pellicle frame. Then final shape of the pellicle frame can be obtained by polishing and processing the plate-like original material.

The original material is then subjected to double face polishing in order to form a plate-like material having predetermined flatness and parallelism as the finally obtainable pellicle frame.

Generally, the double face polishing includes a lapping step for cutting roughly and a polishing step to provide a mirror surface. When the flatness of a plate-like material is measured with a laser interference type measuring instrument which will be described hereafter, the measurement can be conducted to the plate-like material which has been subjected to only the lapping step. However, when the parallelism between both planes of the plate-like material is to be measured, it is indispensable to conduct the polishing step because an interference fringe necessary for the measurement can not be obtained unless the both planes are finished to have mirror surfaces. Although it is efficient for the lapping step and the polishing step to be subjected to multistage processing, it is advantageous for the both steps to be subjected to one stage processing from the viewpoint of cost.

Figure 8:
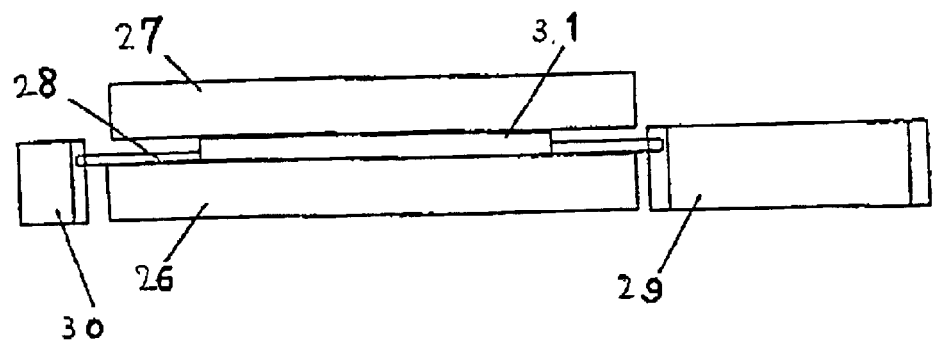
FIG. 8 is a diagrammatical side view showing an important portion of a double face polishing apparatus.
Figure 9:
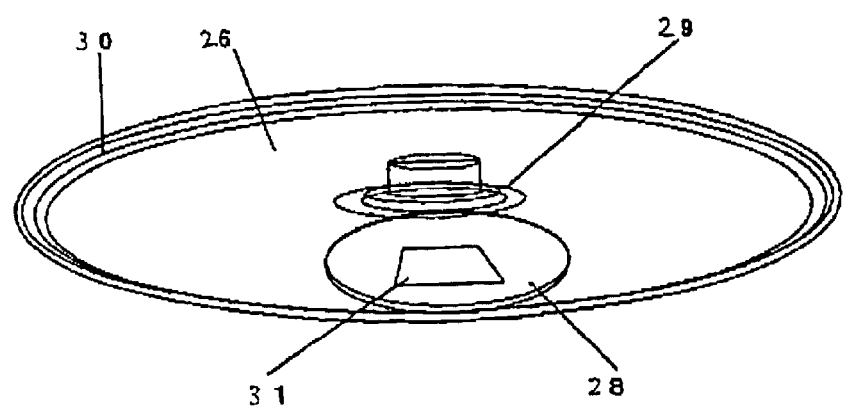
FIG. 9 is a diagrammatical perspective view of an important portion of the double face polishing apparatus.

A double face polishing apparatus can be used for both the lapping step and the polishing step. As the double face polishing apparatus, such one as shown in FIGS. 8 and 9 is known. The polishing apparatus comprises a lower platen 26 and an upper platen 27 which are made of cast iron or the like. The lapping step is carried out by using opposing surfaces of lower and upper platens of cast iron and the polishing step is carried out by attaching polishing cloths on the opposing surfaces of the platens.

A carrier 28 as a work supporter has an outer circumferential portion in which a gear is formed. The carrier is set between a sun gear 29 and an internal gear 30 located in the apparatus so that at least one of the upper and lower platens is rotated during the revolution of the carrier, whereby both surfaces of a work 31 can be polished simultaneously.

A polishing agent supplying port is formed in the upper platen to supply a polishing agent to the work although the port is not shown in the drawing. In the lapping step, diamond, silicon carbide or alumina is used, and in the polishing step, cerium oxide, zirconium oxide, colloidal silica or the like is used. With such double face polishing apparatus, a plate-like material having excellent flatness of upper or lower plane, excellent parallelism between the upper and lower planes and a predetermined thickness can be obtained.

It is preferable for the plate-like material thus obtained that the silica glass sheet after the polishing, which is usable as the pellicle frame, has at least one plane having a flatness of not more than 1 $\mu$m and a parallelism between both planes of not more than 2 $\mu$m. In the confirmation has to whether or not the plate-like material obtained by the above-mentioned processing as a predetermined flatness, a laser interference type measuring instrument using a commercially available He—Ne laser may be used. When the parallelism between the upper and lower planes is measured, the above-mentioned laser interference type measuring instrument can be used wherein an interference fringe between the two planes can be obtained by conducting coherent beam adjustment in the same measuring method, and it is possible to conduct quantification and the formation of a proper shape by analyzing the interference fringe.

The plate-like material thus obtained is processed into a frame member usable as the pellicle frame. Generally, an end mill or the like is used to process the plate-like material into a frame-like shape. In this case, it is desirable to conduct a chamfering operation to edges defined by upper and lower planes and a side plane of the frame-like member. Instead of the polishing by the end mill, a water jet machine or a cutting machine using laser may be used to form a frame member from the plate-like material.

If needed, air holes may be formed in a side plane of the pellicle frame by using a drill, or dimples for chucking may be formed by an end mill.

Further, it is preferable that inner and outer side planes of the frame is polished or the entirety of the frame is etched by HF or the like in order to improve the strength of the frame or prevent the generation of dust from the rough planes after the polishing.

The pellicle frame according to the present invention can be used for a pellicle suitable for exposed light having a wavelength of 220 nm or less, in particular, $F_2$ laser.

In the present invention, the pellicle sheet is preferably made of silica glass having a thickness of from about 0.01 to 2 mm. When it is subjected to exposure to light having a short wavelength, in particular, a wavelength of 220 nm or less, synthesized silica glass is preferably used.

The thickness of the pellicle sheet is preferably 2 mm or less because that it can suppress the birefringence of the pellicle sheet itself. In particular, the thickness of 1 mm or less provides a good transmittance, and the temperature rise of the pellicle sheet at the time of exposure to light can be suppressed because there is little absorption in the pellicle sheet. Accordingly, the generation of a thermal stress in the pellicle can preferably be suppressed. It is preferable that the thickness of the pellicle sheet is 0.01 mm or more from the viewpoint of strength.

The adhesive used for bonding the pellicle sheet to the pellicle frame may be, for example, a poly butene resin, acrylic resin, epoxy resin, silicone type adhesive, fluorine type adhesive or the like. In particular, the fluorine type adhesive is preferred because it has durability to ultra-violet rays and it suppresses the generation of dust.

The thickness of a bonding member should be 1 $\mu$m or more because the deformation of the pellicle due to a temperature change can be moderated and good light exposure is obtainable. Further, when the pellicle sheet is bonded to the pellicle frame, the thickness of the bonding member is preferably 1 $\mu$m or more because a pressing force can uniformly be applied to them with a pellicle mounter, and the pellicle sheet can be fixed to the frame in a horizontal state.

In the following, description will be made concretely as to the processing of the pellicle frame. However, the present invention is not restricted to the example described below.

A synthesized silica glass ingot having a thermal expansion coefficient of $6.0 \times 10^{-7}/^\circ$ C. or less, produced by a conventional method, was cut into a shape of 152 mm×152 mm×5.2 mm (thickness) by using an inner blade type slicer to prepare 15 synthesized silica glass sheets as samples. Then, a chamfering operation was conducted to each sample with a commercially available NC chamfering machine to provide a chamfered shape of C0.3 to 0.7. Then, each sample was immersed in 5 mass % of HF solution in order to stop the progress of cracks caused by cutting and cracks by the chamfering.

Then, these plate-like materials of synthesized silica glass were subjected to the lapping treatment to obtain a thickness of 5.05 mm with use of a double face lapping machine (Model No. 20B, manufactured by Speed Fam Corporation) and by using slurry obtained by suspending in filtrate 10 to 20 mass % of FO#1200 (tradename, manufactured by Fujimi Incorporated) as a polishing agent.

Further, the plate-like materials of synthesized silica glass after the lapping treatment were immersed in 5 mass % of HF solution to conduct an etching treatment. Then, these synthesized quartz glass sheets were polished with the double face lapping machine (Model No. 20B, manufactured by Speed Fam Corporation in which slurry containing cerium oxide as the main component and a polyurethane pad were used, whereby 15 plate-like members having a thickness of 5.00 mm were obtained as pellicle frames.

The flatness of these plate-like members was measured with a laser interference type measuring instrument (Model No. FM200, manufactured by Tropel Corporation to obtain a result that the flatness of one plane was 0.52 to 0.73 $\mu$m and the flatness of the other plane was 0.68 to 0.75 $\mu$m. In the measurement of the parallelism of these samples, it was found that 2.00 $\mu$m or less in any plate-like member.

Then, the plate-like members were processed with an end mill to obtain pellicle frames each having a rectangular frame body of outer dimensions of 149 mm×122 mm and inner dimensions 145 mm×118 mm wherein a rounded portion of a radius of 5 mm was provided at each corner portion.

Then, outer and inner peripheries of the pellicle frames were ground with diamond powders bonded by resin and an air hole having a diameter of 0.5 mm was formed in the pellicle frames with a drill. Further, the pellicle frames were immersed in an etching bath containing 10 mass % of hydrofluoric acid while supersonic waves were applied thereto for 5 minutes to etch the entirety of the pellicle frames.

Thereafter, a ultraviolet curing type adhesive was coated on an upper plane of the pellicle frames to join the pellicle frames with pellicle sheets having a thickness of 0.8 mm in a temperature controlled bath of a temperature of 20° C. Then, ultraviolet rays were irradiated at 3000 J/cm$^2$ to cure the adhesive. Thus, each pellicle frame was bonded to each pellicle sheet.

A dustproof filter (tradename: GORETEX, manufactured by W. L. Gore & Associates, Inc.) was provided at an opening of the air hole which was formed in a side surface of each of the pellicle frames so as to face an inner side of the frame. Thus pellicles were prepared.

According to the present invention, a material having the same thermal expansion coefficient as synthesized silica glass as the material for a pellicle sheet is used for a pellicle frame wherein the flatness of each upper or lower plane of the pellicle frame is not more than 1 µm and the parallelism between upper and lower planes of the pellicle frame is not more than 2 µm. Since an adhesive is not used to bond the pellicle frame surface to a photo-mask, the parallelism between the pellicle sheet and the photo-mask can be maintained well. Further, the deterioration of the adhesive is avoidable because at least a part of the adhesive is not exposed to air because the adhesive is filled in the concave portion formed between the pellicle frame and the photo-mask.

Further, a pellicle frame made of silica glass wherein the flatness of its upper or lower plane is not more than 1 µm and the parallelism between upper and lower planes is not more than 2 µm can effectively be obtained.

The entire disclosures of Japanese Patent Application No. 2001-356313 filed on Nov. 21, 2001 and Japanese Patent Application No. 2001-381168 filed on Dec. 14, 2001 including specifications, claims, drawings and summaries are incorporated herein by reference in their entireties.

What is claimed is:

1. A pellicle structure for attaching a pellicle to a photo-mask, comprising:
   a pellicle including a vehicle frame having at least a portion of a surface directly in contact with the photo-mask without interposing an adhesive, and a pellicle sheet attached to an opening portion formed in the pellicle frame; and
   an auxiliary member positioned to press the vehicle frame against the photo-mask,
   wherein the auxiliary member is provided with a bonded plane to be bonded to the photo-mask and an engaged plane to be engaged with the pellicle.

2. The pellicle structure for attaching a pellicle to a photo-mask according to claim 1, wherein the auxiliary member has an L-shaped body in cross section so that a top portion, as the bonded plane, of the L-shaped auxiliary member is bonded to the photo-mask and a horizontal portion, as the engaged plane, of the L-shaped auxiliary member is engaged with the pellicle.

3. The pellicle structure for attaching a pellicle to a photo-mask according to claim 1, wherein the pellicle frame has a step portion at its outer periphery and the auxiliary member is engaged with the pellicle at the step portion.

4. The pellicle structure for attaching a pellicle to a photo-mask according to claim 1, wherein the auxiliary member is engaged with the pellicle on a surface of the pellicle sheet.

5. A pellicle structure for attaching a pellicle to a photo-mask according to claim 1, having a pellicle including a pellicle frame having at least a portion of a surface directly in contact with the photo-mask without interposing an adhesive, and a vehicle sheet attached to an opening portion formed in the pellicle frame, and an auxiliary member positioned to press the pellicle frame against the photo-mask, wherein the pellicle frame is produced by a manufacturing method comprising:
   preparing a silica glass sheet having larger outer dimensions than the outer configuration of the pellicle frame and a larger thickness than the height of the pellicle frame;
   polishing both surfaces of the silica glass sheet; and
   processing the silica glass sheet after the polishing to obtain a frame-like member.

6. The pellicle structure for attaching a pellicle to a photo-mask according to claim 5, wherein said manufacturing method further comprises measuring the flatness and parallelism of the silica glass sheet before the processing.

7. The pellicle structure for attaching a pellicle to a photo-mask according to claim 6, wherein the silica glass sheet after the polishing, which is usable as the pellicle frame, has at least one plane having a flatness of not more than 1 µm, and a parallelism between both planes of not more than 2 µm.

\* \* \* \* \*